United States Patent
Salerno

(10) Patent No.: US 7,471,140 B2
(45) Date of Patent: Dec. 30, 2008

(54) CIRCUIT DEVICE FOR FILTERING OR IMPEDANCE MATCHING

(75) Inventor: Raffaele Salerno, Tavagnacco (IT)

(73) Assignee: Infineon Technologies AG, Munich (DE)

(*) Notice: Subject to any disclaimer, the term of this patent is extended or adjusted under 35 U.S.C. 154(b) by 80 days.

(21) Appl. No.: 11/532,761

(22) Filed: Sep. 18, 2006

(65) Prior Publication Data

US 2007/0064371 A1 Mar. 22, 2007

(30) Foreign Application Priority Data

Sep. 19, 2005 (EP) .................................. 05020357

(51) Int. Cl.
H03F 1/08 (2006.01)
H03K 17/16 (2006.01)

(52) U.S. Cl. ...................... 327/551; 327/311; 333/17.3; 455/307

(58) Field of Classification Search ........................ None
See application file for complete search history.

(56) References Cited

U.S. PATENT DOCUMENTS

| 5,708,573 | A | * | 1/1998 | Lusher et al. | ............ 363/47 |
| 6,204,715 | B1 | * | 3/2001 | Sellnau et al. | ............ 327/309 |
| 6,469,562 | B1 | * | 10/2002 | Shih et al. | ............ 327/362 |
| 6,737,911 | B2 | * | 5/2004 | Ausserlechner | ............ 327/553 |
| 7,212,068 | B2 | * | 5/2007 | Onody | ............ 327/553 |
| 2004/0155702 | A1 | | 8/2004 | Danielsson | ............ 327/552 |

OTHER PUBLICATIONS

Sallen et al., A Practical Method of Designing RC Active Filters, IRE Transactions-Circuit Theory, p. 74-85, 1955, Mar. 1955.
Weldon et al., A 1.75-GHz Highly Integrated Narrow-Band CMOS Transmitter with Harmonic-Rejection Mixers, IEEE Journal of Solid-State Circuits, vol. 36, No. 12, pp. 2003-2015, Dec. 2001.

* cited by examiner

Primary Examiner—Lincoln Donovan
Assistant Examiner—Terry L Englund
(74) Attorney, Agent, or Firm—Slater & Matsil, L.L.P.

(57) ABSTRACT

A circuit device has a passive network (101) with an input (109) and an output, the output of the passive network (101) forming an output terminal (103) of the circuit device and a feedback path coupling the output terminal (103) of the circuit device to the input (109) of the passive network (101), the feedback path having an amplifier (107) configured to adjust an attenuation of the circuit device.

25 Claims, 6 Drawing Sheets

Forward Buffer (Prior Art)

CIRCUIT DEVICE FOR FILTERING OR IMPEDANCE MATCHING

PRIORITY

This application claims priority from European Patent Application No. 05 020 357.9, which was filed on Sep. 19, 2005, and is incorporated herein by reference in its entirety.

TECHNICAL FIELD

The invention relates to a circuit device and in particular to a circuit device forming a filter or an impedance matching element.

BACKGROUND

Wideband systems have recently received a great deal of interest due to their potential for high-speed wireless communication. Among the several new wireless technologies, Ultra-Wide-Band (UWB) communication is expected to be used for many consumer electronic products in the near future. A UWB system transmits an extremely low-power signal over a wide range of frequencies from 3.1 to 10.6 GHz allowing data rates as high as several hundred Mb/s. To keep this solution cost-effective, the bill of materials (BOM) must be reduced as well as the power consumption. Moreover, the advantage of combining the base-band circuitry and the RF front-end on one single chip is strongly desired. Therefore, the CMOS technology is a good candidate for achieving this goal since it also takes advantage of process shrinking to reduce the overall power consumption and cost over the generations.

A significant amount of power is consumed by filter devices which, by way of example, perform filtering with a third-order low-path filter having a cut-off frequency at e.g. 400 MHz.

FIG. 10 shows a conventional Sallen & Key filter using an operational amplifier (forward buffer with a non-unity gain) as shown in FIG. 11 and a feedback capacitor C. The feedback capacitor C introduces a zero in the transfer function which decreases the attenuation of the filter at higher frequencies, for example above 400 MHz. One method of improving the attenuation is to increase the bandwidth of the forward buffer used in the filter. This is, however, associated with an increased power consumption. The conventional Sallen & Key filters further suffer from a large demand for a silicon area and a demand for a high power supply voltage.

SUMMARY

A circuit device may comprise a passive network with an input and an output, the output of the passive network forming an output terminal of the circuit device; and a feedback path coupling the output terminal of the circuit device to the input of the passive network, the feedback path comprising an amplifier configured to adjust an attenuation of the circuit device.

BRIEF DESCRIPTION OF THE DRAWINGS

Further embodiments of the invention will be described with respect to the following figures, in which.

DETAILED DESCRIPTION

Figure 1:
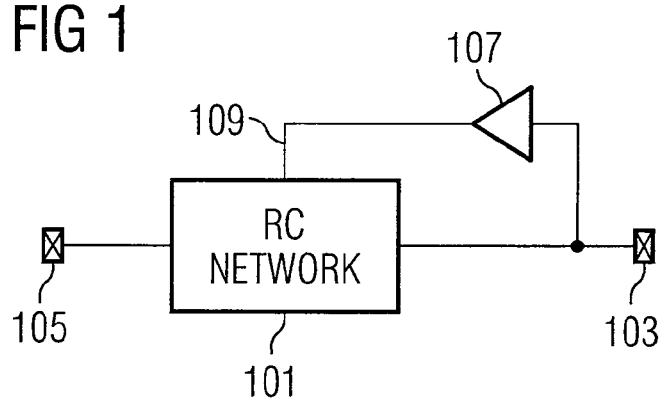
FIG. 1 shows a block-diagram of a circuit device according to an embodiment.

The invention is based on the finding that the attenuation of the circuit device may be adjusted, e.g. increased or decreased, when transferring an amplifier from a forward path to a feedback path, i.e. when arranging the amplifier in the feedback path, only. In this case, an operational amplifier is not necessary and can be replaced by e.g. a source follower which reduces the power consumption.

For example, the circuit device may comprise a passive network with two inputs and an output, the output of the passive network forming an output terminal of the circuit device. According to an embodiment, a feedback path can be provided which couples the output terminal of the circuit device to one input of the passive network, the feedback path comprising an amplifier which is configured to adjust, e.g. to increase or to decrease, the attenuation of the circuit device.

The attenuation of the circuit device determines the attenuation which is introduced by the circuit device at a certain frequency or within a certain frequency band. Thus, signals passing the circuit device or signals being reflected at the circuit device are attenuated at the certain frequency or within the certain frequency band by the amount of attenuation which is determined by the attenuation of the circuit device.

For example, the passive network may further comprise a passive impedance element coupling an input terminal of the circuit device to the passive network, e.g. to an intermediate node of the passive network. According to an embodiment, the amplifier placed in the feedback path has an output impedance which is smaller than an impedance of the passive impedance element, for example resistor, coupling the input terminal of the circuit device to the passive network. In this case, the attenuation of the circuit device is increased.

Accordingly, in order to decrease the attenuation of the circuit device, the output impedance of the amplifier in the feedback path may be greater than the impedance of the passive impedance element coupling the input terminal to the passive network.

Thus, the ratio between the impedance of the impedance element coupling the input terminal of the circuit device to the passive network and the output impedance of the amplifier arranged in the feedback path of the circuit device determines an attenuation of the circuit device which is introduced when applying signals at the input terminal and receiving a received version thereof at the output terminal of the circuit device. Thus, when varying the above mentioned impedance ratio, the attenuation of the circuit device may be adjusted.

Preferably, the passive network is an RC network comprising resistors and capacitors, only. The passive network may be applied to adjust a frequency characteristic of the circuit device, e.g. band pass characteristic, low pass characteristic or high pass characteristic. For example, the circuit device may form a filter. In this case, the passive network preferably determines an order of the filter and the amplifier increases the attenuation of the filter within a stop-band.

However, the circuit device may form an impedance matching element. In this case, the passive network may be configured to adjust a frequency characteristic of the circuit device and the amplifier may be configured to adjust (to increase or to decrease) an impedance of the circuit device. More specifically, a gain factor of the amplifier, which may be variable, may be applied to adjust the impedance (and, thus, the attenuation) of the circuit device. For example, the impedance may be adjusted by the gain factor within a certain frequency band, e.g. within a pass-band or within a stop band, which may be determined by a frequency characteristic of the passive network.

According to an embodiment, a high performance continuous-time filter (CTF) can be provided which can be used in high frequency applications. The filter is based on the Sallen-Key topology comprising a passive network implementing the desired complex poles around e.g. a unity-gain buffer with local feedback in order to reduce its output impedance, so that the attenuation within the stop-band is increased. Moreover, the buffer is used in the feedback path instead of being arranged in the forward path in order to improve the attenuation. In other words, the forward path does not comprise any buffer (amplifier) at all and consists only of passive elements. In order to avoid loading the filter, either an additional stand-alone buffer can be placed after the filter or the buffering function can be implemented in the next programmable gain amplifier (PGA) stage, by way of example. However, the amplifier arranged in the feedback path may be an integral part of the circuit device. Moreover, the amplifier may have a gain factor which is different (e.g. greater) than one. For instance, the amplifier could be made up of an first gain stage (e.g. emitter coupled pair with resistive load) and the source follower with low output impedance and thus high attenuation. By using a high gain amplifier in the feedback loop a higher Q of the circuit device can be achieved.

The amplifier forming the active device may be formed as a source follower circuit. The source follower circuit may comprise a transistor, e.g. a field-effect transistor in CMOS technology with a gate, a source and a drain, the gate of the transistor being coupled to the output terminal of the circuit device, the source of the transistor being coupled to one input of the passive network. For example, the gate of the transistor may form the output terminal of the circuit device. Accordingly, the source of the transistor may be electrically connected to the input of the passive network.

The source follower circuit representing the amplifier (buffer) may comprise a feedback path coupling the drain of the transistor to the source of the transistor via at least one additional transistor. Moreover, the source follower may comprise a further feedback path additionally coupling the drain to the source via another transistor.

According to an embodiment, the circuit device may be arranged to form a differential circuit. In this case, the circuit device preferably comprises a further passive network having two inputs and an output, the output of the further passive network forming a further output of the circuit device. Furthermore, the circuit device may comprise a further feedback path coupling the further output of the further passive network to one input of the further passive network, the further feedback path comprising a further amplifier configured to adjust the attenuation of the circuit device. Thus, the output terminal and the further output terminal of the circuit device form a differential output of the circuit device.

According to an embodiment, the further passive network may comprise a further impedance element (e.g. a resistor) coupling a further input terminal of the circuit device to the passive network, e.g. to another intermediate node of the passive network. Thus, the input terminal and the further input terminal form a differential input of the circuit device.

According to an embodiment, both parts forming the differential of character of the circuit device may be symmetric and identical. For example, the further passive network is identical with the passive network and the further amplifier is identical with the amplifier.

When compared with the conventional Sallen & Key structure, the operational amplifier is preferably replaced by a source follower and transferred from the forward path to the feedback path. Thus, the output of the device corresponds to the output of the passive network, wherein the amplifier forming the only active element is arranged in the feedback path and couples the output to one input of the passive network. Thus, an increased attenuation within an stop-band can be achieved at reduced costs since the attenuation within the stop-band depends on the output impedance of the amplifier arranged within the feedback path. Additionally, the power consumption is reduced since the operational amplifier is not necessary and the source follower consumes significantly less power than any operational amplifier.

Moreover, the device may be implemented in the CMOS technology for e.g. high frequency applications at low voltage. However, the circuit can also be implemented in a bipolar and BiCMOS technology as well.

According to an embodiment, the circuit topology provides a high frequency continuous-time filter with high linearity and high stop-band attenuation with reduced power consumption.

FIG. 1 shows a diagram of a circuit device according to an embodiment. The circuit device comprises a passive network 101, e.g. RC network, having an output forming an output terminal 103 of the circuit device. An input terminal 105 of the circuit device is coupled to the passive network 101 via e.g. an input of the passive network 101. The circuit device further comprises an amplifier 107 arranged in a feedback path, the amplifier 107 being coupled between the output terminal 103 and a further input 109 of the passive network. More specifically, the output terminal 103 is connected with an input of the amplifier 107, an output of the amplifier 107 being connected to the further input 109 of the passive network 101.

The passive network 101, for example a resistive-capacitive network, is arranged to introduce additional real poles with purely passive elements for increasing an order of the filter being formed by the circuit device. For example, the device of FIG. 1 may be arranged to form a second-order Sallen & Key low-pass filter. In this case, the RC network 101 determines the low-pass characteristic of the filter and introduces at least one real pole in order to adjust the filter order.

Figure 10:
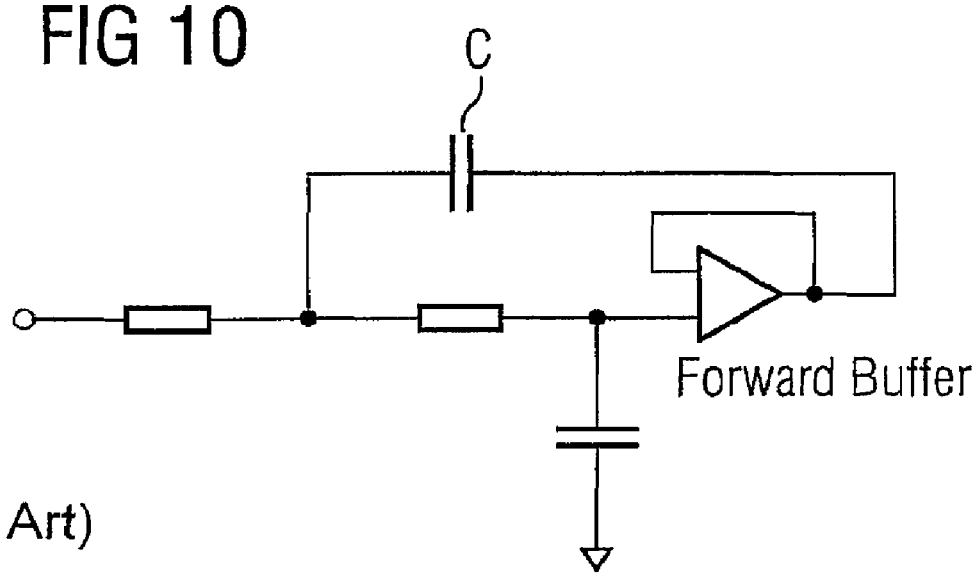
FIG. 10 shows a conventional Sallen-Key filter.
Figure 11:
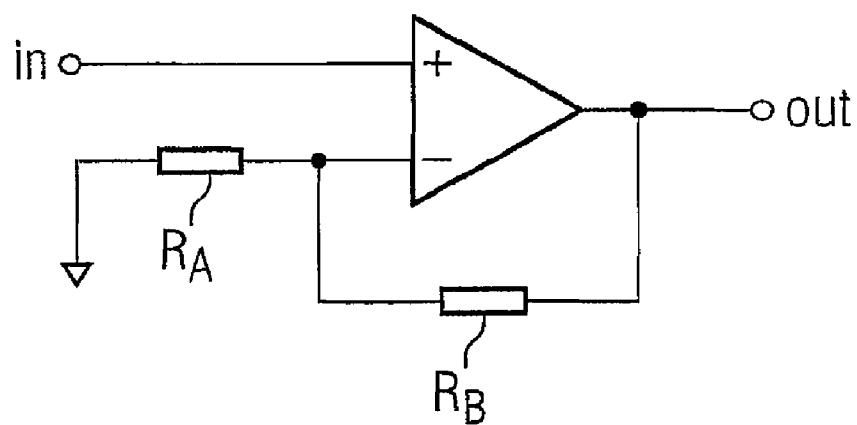
FIG. 11 shows an operational amplifier.

However, when compared to the conventional Sallen & Key structure shown in FIG. 10, the network device acting e.g. as a filter comprises in the forward path between the terminals 105 and 103 the passive network 101 only. An active network, e.g. a source follower forming the amplifier 107 is arranged in the feedback path in order to adjust the attenuation of the filter.

Figure 2:
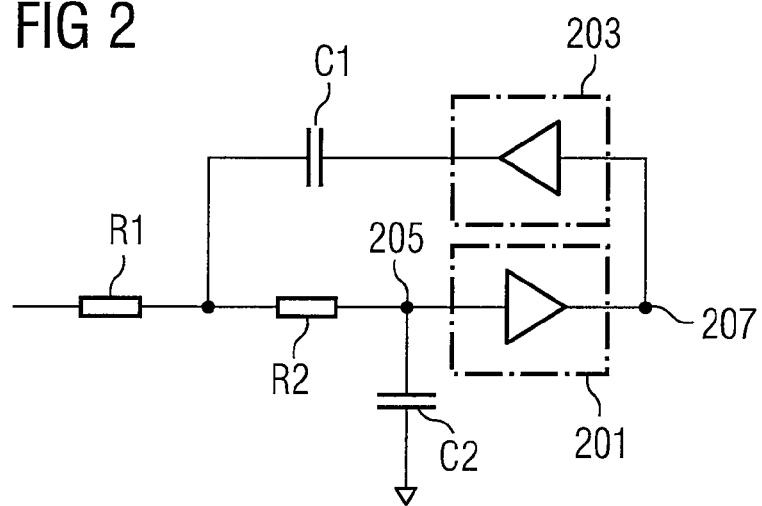
FIG. 2 shows a block-diagram of a circuit device according to an embodiment.

As aforementioned, the capacitor arranged in the feedback path of the filter depicted in FIG. 10 introduces a zero which may cancel an associated pole of the filter. The effect of the zero may be reduced by adding a buffer in the feedback path as shown in FIG. 2 depicting a Sallen & Key filter with an enhanced rejection. The filter comprises a passive network with the impedance elements R1, R2 (e.g. resistors), a capacitor C1 arranged in the feedback path and a capacitor C2 coupling an input of an operational amplifier 201 to ground. The feedback path further comprises an amplifier 203 connected between an output of the operational amplifier 201 and the capacitor C1. The buffer 203 blocks the zero introduced by the capacitor C1 allowing for a lower bandwidth in the forward buffer 201. At higher frequencies, approximately a 10-dB improvement is predicted by simulation with the feedback amplifier 203, as compared to a conventional Sallen-Key filter.

The amplifier 203 may be a conventional operational amplifier. However, the amplifier 203 may be a source follower.

According to an aspect, the circuit device of FIG. 2 may comprise an intermediate node 205 forming an output terminal of the circuit device. In this case, the amplifier 201 and the amplifier 203 are arranged in the feedback path in series in order to adjust the attenuation of the filter device. The amplifier 201 may be an operational amplifier or a source follower. Thus, the attenuation of the filter device is determined by a concatenation of the amplifiers 201 and 203, which both may be formed by a source follower circuit by way of example only.

According to an aspect, the circuit device of FIG. 2 may comprise a further node 207 forming an output terminal of the device. In this case, the amplifier 201 may be a conventional operational amplifier and the amplifier 203 may be a source follower arranged to reduce the effect of the zero introduced by the capacitor C1.

According to an aspect, if a unity-gain is chosen, then a source follower can be used instead of the operational amplifier.

In CMOS technology, an output impedance of a (conventional) source follower is high and the bulk effect of NMOS transistors which are used to form the source follower may reduce the gain which degrades the filter mask. In order to mitigate the non-ideal effects, the current through the amplifier may be increased in order to reduce the output impedance.

Figure 3:
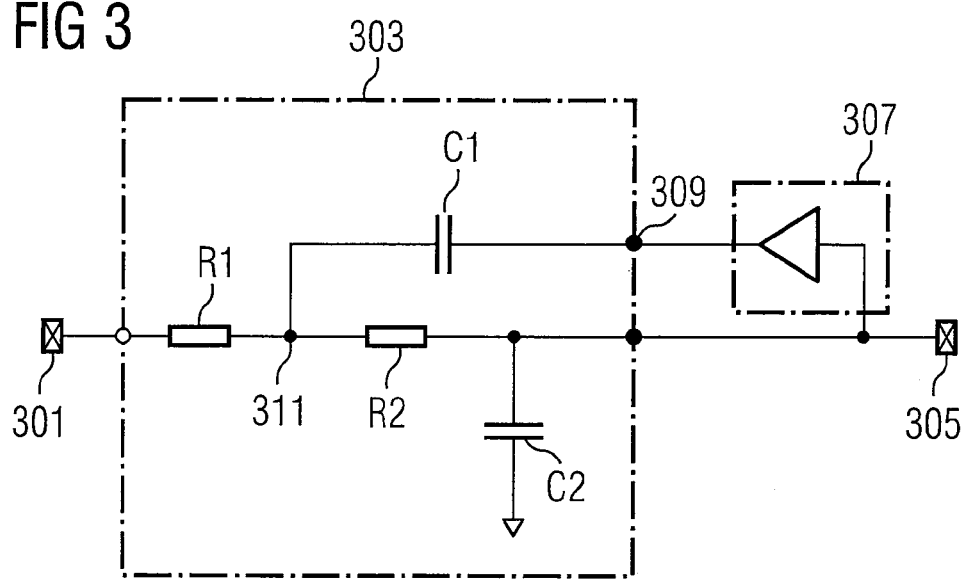
FIG. 3 shows a block-diagram of a circuit device according to an embodiment.

FIG. 3 shows an embodiment of a circuit device forming a second order Sallen-Key filter. The filter comprises an input terminal 301 coupled to a passive network to be 303. The filter comprises further an output terminal 305 and a feedback path comprising an amplifier 307 coupled between the output terminal 305 and an input 309 of the passive network 303. The passive network comprises an impedance element $R_1$ coupled between the input terminal 301 and an intermediate node 311. The input 309 of the network 303 is coupled via a capacitor C1 to the intermediate node 311. The passive network 303 further comprises an impedance element $R_2$ and a capacitor C2 coupling the output terminal 305 to ground.

By way of example, the filter of FIG. 3 has the following transfer function:

$$HSCI = \frac{Voutput}{Vinput} \qquad (1)$$

$$= \frac{1}{S^2 R_1 C_1 C_2 + SC_2(R_1 + R_2) + R_1 C_2(1-a) + 1}$$

wherein a denotes a voltage gain and S is the Laplace complex frequency variable. The filter of FIG. 3 has a cut-off frequency fs $$fs = \frac{1}{2\pi} \frac{1}{\sqrt{R_1 R_2 C_1 C_2}} \qquad (2)$$

and the quality factor Q $$Q = \frac{\sqrt{R_1 R_2 C_1 C_2}}{(R_1 + R_2)C_2 + C_1 R_1 (1-a)} \qquad (3)$$

The attenuation $A_{MAX}$ is $$A_{MAX} = \frac{1}{Q} \frac{fs}{f_1} + \frac{R_1}{R_{out}} \qquad (4)$$

with $$f_1 = \frac{1}{2\pi} \frac{1}{R_1 C_1} \qquad (5)$$

$R_{out}$ denotes the output impedance of the amplifier 307.

Thus, the amplifier 307 (e.g. a source follower) adjusts the attenuation of the filter. More specifically, the ratio between $R_1$ and $R_{out}$ has an impact on the achieved attenuation. In order to achieve e.g. a high attenuation, the amplifier must have a low output impedance. Thus, the output attenuation may vary with varying output impedance of the amplifier 307 or/and with varying $R_1$.

For example, in order to achieve $A_{MAX}$=32 dB at $f_0$=370 MHz with Q=0.878, which values determine the filter characteristics, the filter parameters may be chosen as follows: $R_1$=400 ω, $R_2$=300 ω, $C_1$=1600 fF, $C_2$=400 fF, a=0. 944 which corresponds to approximately −0.5 dB (i.e. amplifier with losses), and $R_{out}$=10 ω.

Figure 4:
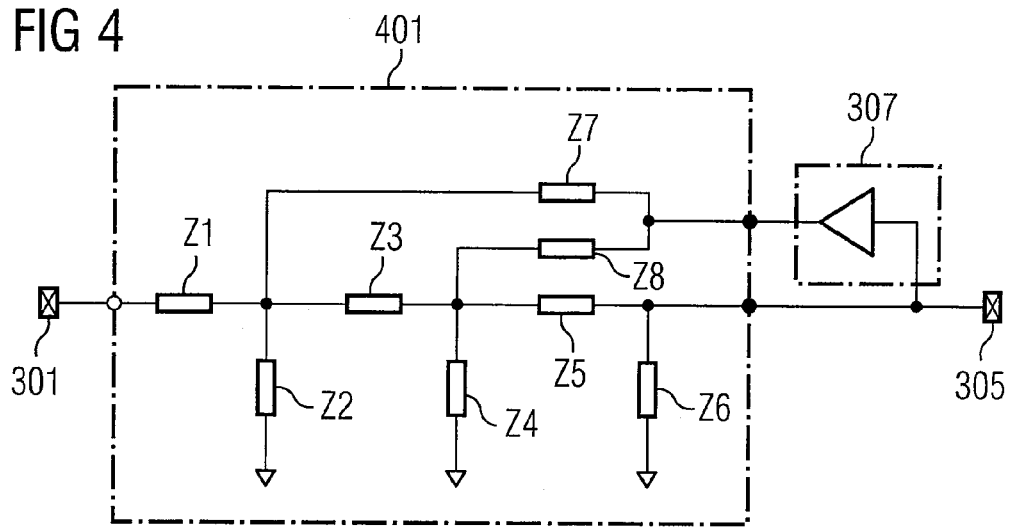
FIG. 4 shows a block-diagram of a circuit device with a ladder network forming the passive network.

FIG. 4 shows a circuit device according to an embodiment. Corresponding to the embodiment of FIG. 3, the circuit device comprises an input terminal 301, an output terminal 305 and an amplifier 307. The device further comprises a passive network 401 comprising a ladder network with passive elements $Z_1$ to $Z_8$ which are arranged as depicted in FIG. 4. The elements $Z_2$, $Z_4$ and $Z_6$ couple the respective intermediate nodes of the network 401 to ground, by way of example. The element $Z_1$ couples the input terminal 301 to an intermediate node of the network 401, which is coupled via the element $Z_2$ to ground. The ladder network may be configured to introduce a plurality of poles in order to adjust a frequency characteristic of the device shown in FIG. 4 which may form a filter. The elements $Z_1$ to $Z_8$ are passive elements, e.g. resistors or capacitors.

Figure 5:
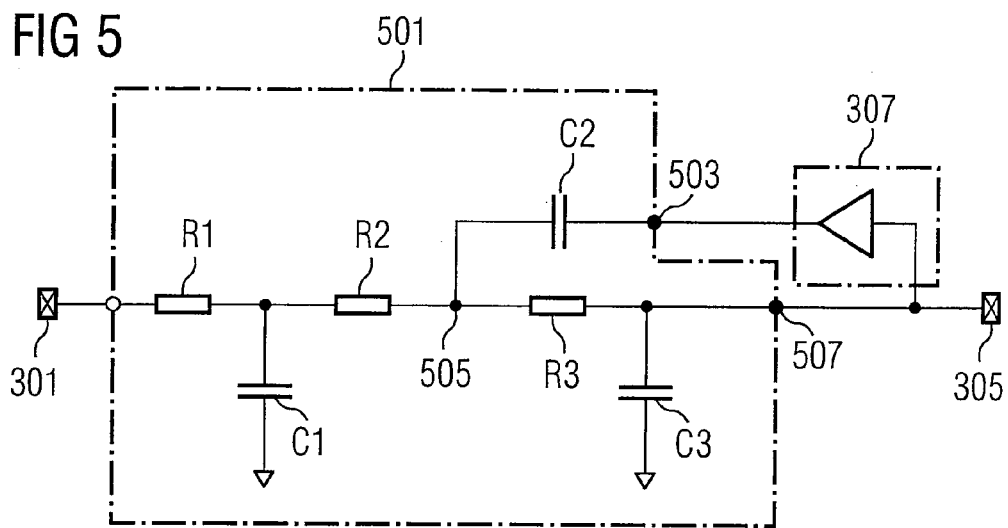
FIG. 5 shows a circuit device forming a third order low-pass filter according to an embodiment.

FIG. 5 shows an embodiment of a circuit device being arranged to form a third order low-pass filter. Unlike the embodiment of FIG. 4, the low-pass filter of FIG. 5 comprises a passive network 501 with resistive elements R1, R2 and R3 and capacitors C1, C3 and C2 which are arranged as depicted in FIG. 5. In particular, the capacitor C2 is connected between an input 503 of the passive network 501 and an intermediate node 505. Furthermore, an output of the amplifier 307 is coupled via the input 503 and the capacitor C2 to the intermediate node 505. The output terminal 305 which is connected to an input of the amplifier 307 is formed by an output 507 of the passive network 501.

As aforementioned, the amplifier arranged in the feedback path may comprise a source follower forming the core of the amplifier. According to an aspect, the amplifier may be formed by a buffer as e.g. described in U.S. Pat. No. 6,580,326 B2.

Figure 6:
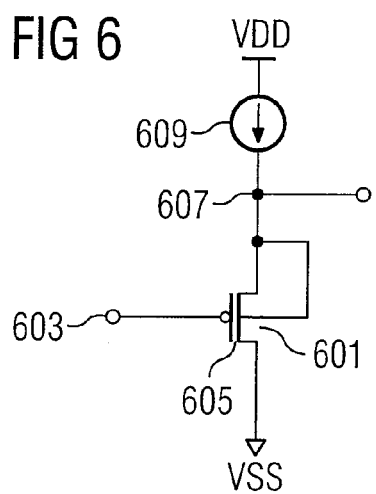
FIG. 6 shows a source follower with unity-gain.

FIG. 6 shows a source follower circuit which may form a basis for the amplifier. The source follower comprises a transistor 601 having a gate 603, a drain 605 and a source 607. By way of example, the source 607 may be connected to a substrate terminal (bulk). The source follower further comprises a current source 609 coupled between a voltage source $V_{DD}$ and the source 607 of the transistor 601. The drain 605 is coupled to $V_{SS}$, which may represent the ground. According to an embodiment, the source 607, usually forming an output of the source follower shown in FIG. 6, is coupled to an input of a passive network, wherein the gate 603 forms an output of a circuit device applying the source follower of FIG. 6 in the feedback path.

Figure 7A:
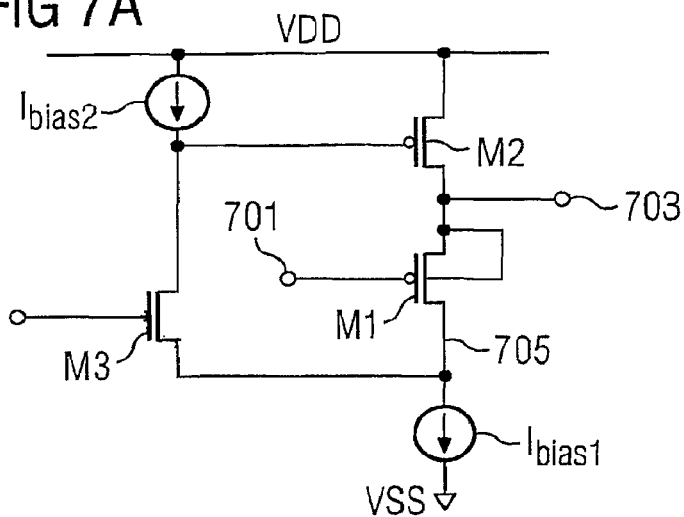
FIG. 7a shows a source follower with single loop feedback.

FIG. 7A shows an source follower with a single loop feedback, the source follower forming an amplifier to be used in the feedback path.

The source follower of FIG. 7A comprises a transistor M1 having a gate 701, a source 703 and a drain 705. The drain 705 is coupled via a current source $I_{BIAS1}$ to $V_{SS}$ which may form the ground. The source follower further comprises a transistor M3 having a source coupled to the drain 705 of the transistor M1 and a gate to which a bias voltage is applicable. A current source $I_{BIAS2}$ is coupled between a voltage source $V_{DD}$ and a drain of the transistor M3. The source follower further comprises a transistor M2 having a gate coupled to an output of the current source $I_{BIAS2}$, a drain coupled to the source 703 of the transistor M1, and a source coupled to the voltage source $V_{DD}$. The single-loop feedback is formed by the transistors M1, M2 and M3. In particular, the source 703 of the transistor M1, forming an output of the source follower, is coupled back to one input of a passive network when using the source follower in a feedback path for e.g. increasing an attenuation of a circuit device. In this case, the gate 701 of the transistor M1 forms an output terminal of the circuit device forming e.g. a filter.

Figure 7B:
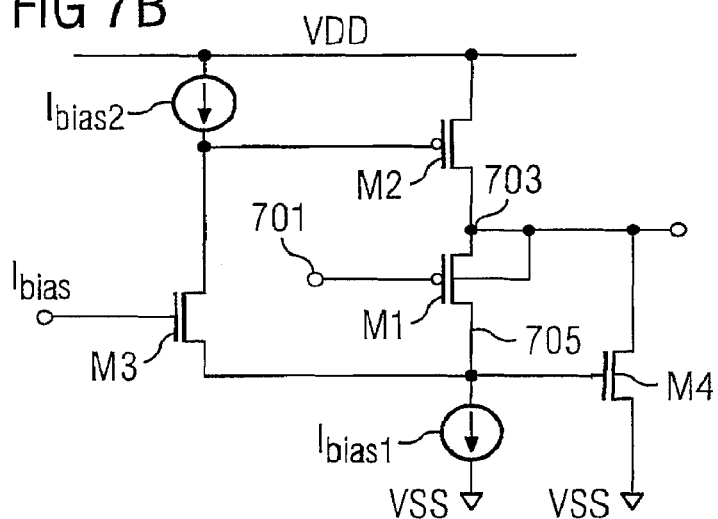
FIG. 7b shows a source follower with a double local feedback.

FIG. 7B shows a source follower with a double local feedback according to an embodiment. The source follower additionally comprises a transistor M4 having a gate coupled to the drain 705 of the transistor M1, a drain coupled to the source 703 of the transistor M1 and a source coupled to $V_{SS}$. Thus, the source follower of FIG. 7B has a first local feedback being formed by the transistors M1, M2 and M3, and a second local feedback being formed by the transistors M1 and M4.

When used in a feedback path, the output of the source follower of FIG. 7B is coupled to an input of a passive network. Correspondingly, an input of the source follower of FIG. 7B being formed by the gate 701 of the transistor M1 forms an output terminal of the circuit device. The same considerations apply to the source follower of FIG. 7A.

Figure 7C:
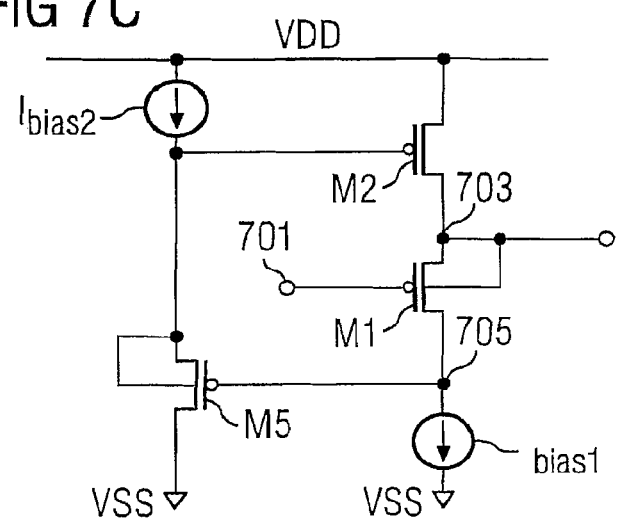
FIG. 7c shows a source follower with a local feedback.

FIG. 7C shows source follower according to a further embodiment with a further implementation of a local feedback via a transistor M5 which can be a PMOS transistor instead of folding by the transistor M3 which can be a NMOS transistor. Therefore, new innovative topologies which implement a feedback around the transistor M1 (e.g. PMOS) of the source follower can be used.

The source followers may be PMOS-based in order to eliminate the bulk effect. Nevertheless, if the application is not so sensitive to this unwanted effect, or if the technology used to implement the device allows triple well option (that means the bulk of the NMOS can be connected to the source, thus solving the above-mention issue), a NMOS-based source follower can also be used.

According to an aspect, the buffer which may be built around the PMOS transistor M1 may also be implemented, complimentarily, in a NMOS technology. That means that the transistor M1 may be a NMOS transistor instead of a PMOS transistor and, therefore, all transistors that build the local feedbacks are complementary to the above declared transistors (i.e., M1, M2, M5 are NMOS's and M3 and M4 are PMOS's).

Figure 8:
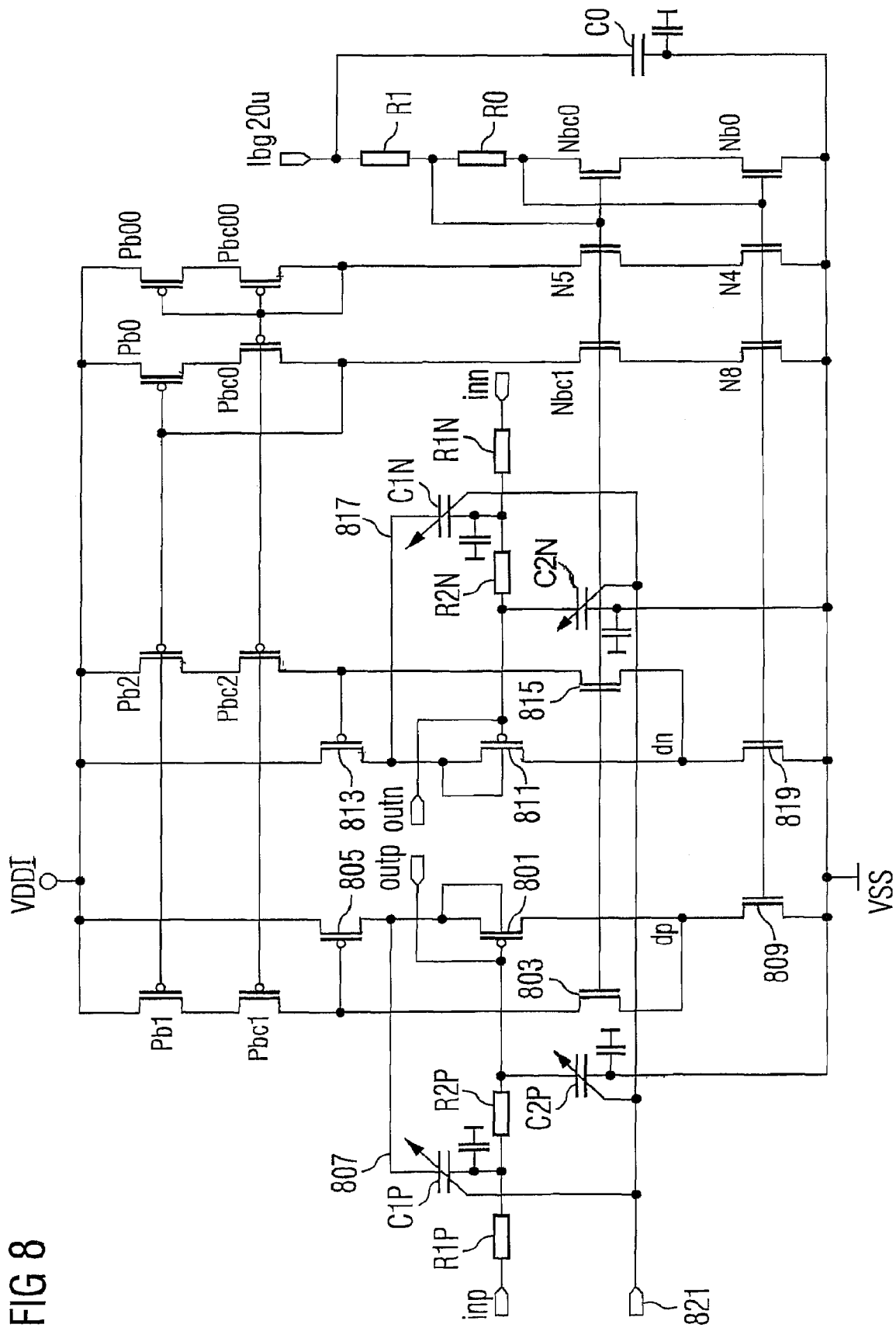
FIG. 8 shows a schematic of a circuit device according to an embodiment.

According to an embodiment, the structures may be differential even if they are drawn in a single-ended manner. FIG. 8 shows an embodiment of a differential circuit device. The device comprises two buffers which may be based on a P-MOS source follower structure with a local feedback in order to reduce both the bulk effect and the output impedance which improves the filter mask. The device of FIG. 8 which may form a differential filter comprises a differential input being formed by the input terminals inp and inn and a differential output being formed by the output terminals outp and outn. The amplifiers are respectively formed by source followers as depicted in FIG. 7A, by way of example only. The first amplifier comprises the transistors 801, 803 and 805 forming a feedback loop. A source of the transistor 801 is coupled to an input 807 of a passive network comprising the elements R1P, R2P, C1P and C2P. A gate of the transistor 801 forms the output outp. The drain of the transistor 801 is coupled via a transistor 809 to $V_{SS}$ which may form the ground. The second amplifier is formed by the transistors 811, 813 and 815. A source of the transistor 811 is coupled via a further input 817 to a further passive network comprising the elements C1N, R2N, R1N and C2N. A drain of the transistor 811 is coupled via a transistor 819 to ground. A gate of the transistor 811 forms the output outn, wherein the input inn of the circuit device is coupled to the further passive network at the resistor R1N.

The transistors Pbc1, Pb1, Pb2, Pbc2 couple the voltage source VDDI to a respective source follower and are formed for biasing. The transistors 809, 819, N8, N4, NB0, NBC0, N5, NBC1 and the resistor R0 and R1 and the capacitor C0 form a biasing circuit which is biased by a current at pin Ibg20u. The transistors PB0, PB00, PBC0 and PBC00 form a further biasing circuit.

The device of FIG. 8 further comprises another input 821 for controlling the values of the capacitors C1P, C2P, C2N and C1N. The output impedance of a corresponding buffer of FIG. 8 and the bandwidth, GBW, are $$R_{out} \approx \frac{1}{g_{m\_PMOS} \cdot A_{loop}} \qquad (6)$$

where $A_{loop}$ is the open loop gain, and $$GBW \approx 2\sqrt{\frac{\mu}{Cox} \frac{I_D}{W \cdot L^3}} \qquad (7)$$

respectively. $I_D$ denotes a drain current, Cox denotes an oxide capacity, W and L denote a width and a length of a gate area of a corresponding transistor, respectively, and µ is a variable. The above equations show that a very low impedance and a high bandwidth can be achieved with low current consumption in deep-micron CMOS technologies.

Figure 9:
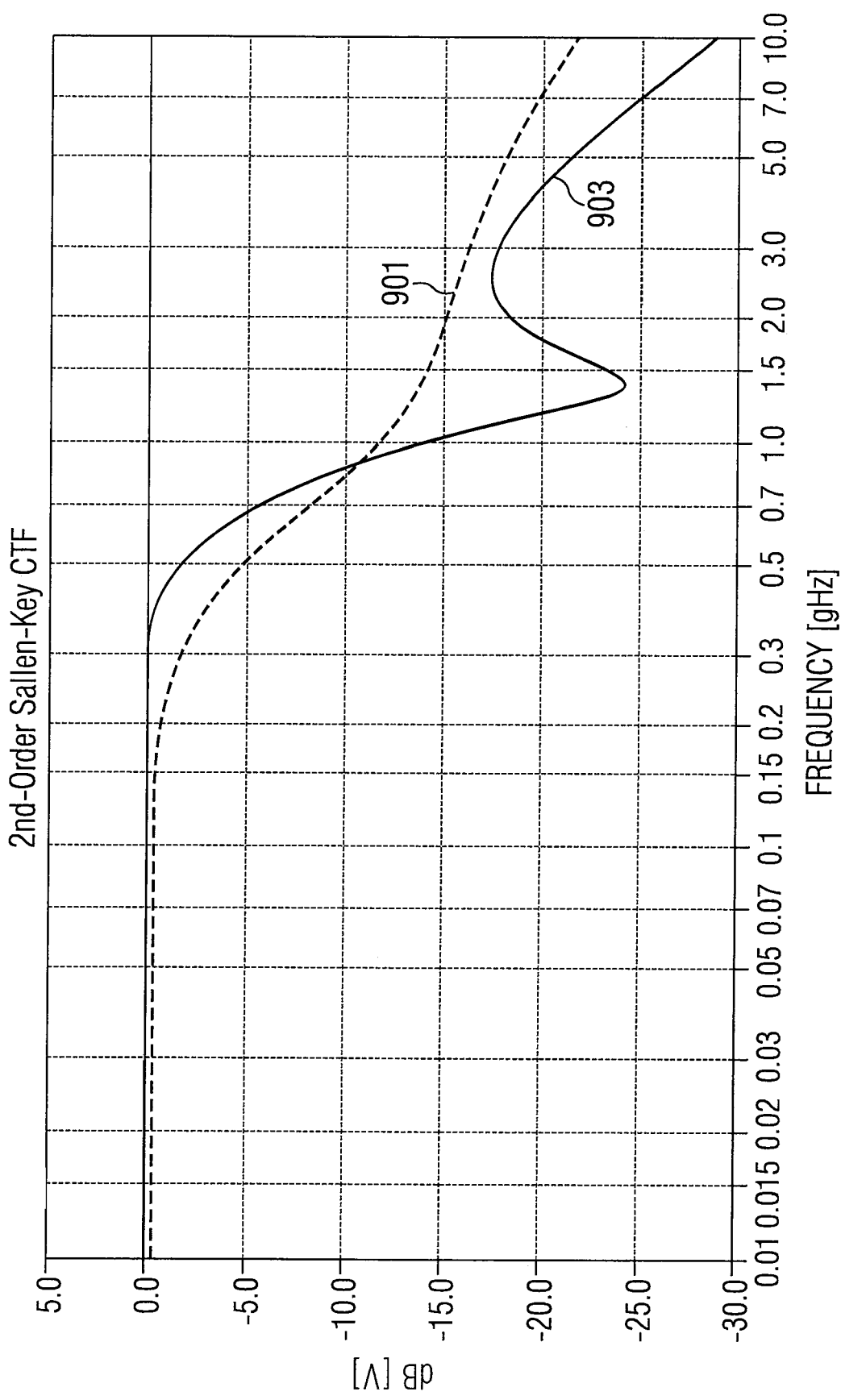
FIG. 9 shows a comparison between a performance of the conventional Sallen-Key filter and a performance of the circuit device of FIG. 8.

FIG. 9 shows a comparison between the proposed second order Sallen & Key filter depicted in FIG. 8 with Vsupply at 1.2 V and Isupply at 400 µA and a comparable standard Sallen & Key filter. The characteristic of the standard Sallen & Key filter comprising a standard emitter follower is represented by the dashed curve 901. The characteristic of the proposed filter is represented by the curve 903. The buffer placed in the feedback loop increases the attenuation of the filter device within the frequency band above around 750 MHz representing a stop-band of the filter.

Moreover, the filter loaded by the PGA of the UWB RX-chain shows a Total Harmonic Distortion, THD, as good as −40 dB with 400 mVpd and 300 MHz signal test requiring only 400 µA from 1.2 V power supply.

Finally, the cut-off frequency of the filter can be easily tunable by changing the capacitance value according with programmable bits coming from a master-slave control loop, not shown in figures. Indeed, this approach is more efficient and easier to implement than the one used in Gm-C approach.

The advantages of the structure of FIG. 8 are e.g. low power and low voltage, high stop-band attenuation and high linearity. In order to achieve the above advantages, the invention provides a Sallen-Key filter which uses a source follower with local feedback loop as amplifier in order to achieve the high-frequency rejection and high linearity. Moreover, the buffer is moved from the forward path to the feedback path which improves the stop-band attenuation. Thus, the disadvantages associated with conventional Sallen & Key filters, namely high power consumption, large silicon area and high power supply voltage are overcome.

What is claimed is:

1. A circuit device, comprising:
   a passive network with an input and an output, the output of the passive network forming an output terminal of the circuit device;
   a feedback path coupling the output terminal of the circuit device to the input of the passive network, the feedback path comprising an amplifier configured to adjust an attenuation of the circuit device, wherein the amplifier comprises a source follower circuit with a transistor, a gate of the transistor coupled to the output terminal of the circuit device and a source of the transistor being coupled to the input of the passive network, and wherein the source follower circuit also comprises local feedback via a further transistor, the further transistor comprising a MOS transistor.

2. A circuit device according to claim 1, wherein the amplifier is configured to increase or to decrease the attenuation of the circuit device.

3. A circuit device according to claim 1, wherein the passive network further comprising a passive impedance element coupling an input terminal of the circuit device to the passive network.

4. A circuit device according to claim 3, wherein an output impedance of the amplifier being smaller than an impedance of the passive impedance element.

5. A circuit device according to claim 1, wherein the passive network being configured to adjust a frequency characteristic of the circuit device.

6. A circuit device according to claim 1, wherein the passive network being an RC network.

7. A circuit device according to claim 1, wherein the circuit device forming a filter, the passive network determining an order of the filter and the amplifier increasing the attenuation of the filter within a filter stop-band.

8. A circuit device according to claim 1, wherein the circuit device forming an impedance matching element, the passive network adjusting a frequency characteristic of the circuit device and the amplifier adjusting an impedance of the circuit device.

9. A circuit device according to claim 1, wherein the amplifier having a unity-gain.

10. A circuit device according to claim 1, wherein the amplifier having a gain different than 1.

11. A circuit device according to claim 1, wherein the circuit device is implemented in a CMOS technology or in a BiCMOS technology.

12. A circuit device according to claim 1, wherein the further transistor comprises a PMOS transistor.

13. A circuit device according to claim 1, wherein the transistor comprises a PMOS transistor.

14. A circuit device according to claim 1, wherein the transistor comprises a NMOS transistor.

15. A circuit device according to claim 1, further comprising:
   a further passive network with an input and an output, the output of the further passive network forming a further output terminal of the circuit device;
   a further feedback path coupling the further output terminal to the input of the further passive network, the further feedback path comprising a further amplifier configured to adjust the attenuation of the circuit device, the output terminal and the further output terminal forming a differential output of the circuit device.

16. A circuit device according to claim 15, wherein the further passive network comprising a further passive impedance element coupling a further input terminal of the circuit device to the further passive network, the input terminal and the further input terminal of the circuit device forming a differential input of the circuit device.

17. A circuit device according to claim 15, wherein the further passive network being identical with the passive network, the further amplifier being identical with the amplifier.

18. A circuit device, comprising:
   a passive network with an input and an output, the output of the passive network forming an output terminal of the circuit device; and
   a feedback path coupling the output terminal of the circuit device to the input of the passive network, the feedback path comprising an amplifier configured to adjust an attenuation of the circuit device, wherein
      the amplifier comprises a source follower circuit with a transistor, a gate of the transistor forming the output terminal of the circuit device and a source of the transistor being coupled to the input of the passive network, and
      the source follower circuit comprises a feedback path coupling a drain of the transistor to the source of the transistor, and a further feedback path with a complementary transistor coupling the drain of the transistor to the source of the transistor.

19. A continuous time filter comprising:
   a passive network comprising an input node, and output node and a feedback node, the input node coupled to a filter input, and the output node coupled to a filter output;
   a follower circuit comprising
      a follower transistor, wherein a control node of the follower transistor is coupled to the passive network output node, and a first output node of the follower transistor is coupled to the passive network feedback node;

a local feedback circuit coupling the first output node of the follower transistor to a second output node of the follower transistor, the local feedback circuit comprising at least one further transistor.

20. The filter of claim 19, wherein the passive network comprises a programmable impedance element.

21. The filter of claim 19, wherein the follower transistor comprises an MOS device, wherein:
the follower transistor control node comprises a gate of the MOS device;
the follower transistor first output node comprises a source of the MOS device; and
the follower transistor second output node comprises a drain of the MOS device.

22. The filter of claim 19, wherein the passive network and follower circuit are part of a differential circuit.

23. A semiconductor circuit comprising:
a passive network comprising an input node, and output node and a feedback node;
a source follower transistor, wherein a gate of the source follower transistor is coupled to the output node and a source of the source follower transistor is coupled to the feedback node;
a first current source coupled to a drain of the source follower transistor;
a second transistor coupled to the drain of the source follower transistor;
a third transistor coupled to the source of the source follower transistor;
a second current source coupled to the second transistor and to a gate of the third transistor.

24. The semiconductor circuit of claim 23, wherein:
the source follower transistor comprises a PMOS transistor;
the second transistor comprises an NMOS transistor;
a source of the second transistor is coupled to the drain of the follower transistor;
a drain of the second transistor is coupled to the second current source; and
the third transistor comprises PMOS transistor.

25. The semiconductor circuit of claim 23, wherein:
the source follower transistor comprises a PMOS transistor;
the second transistor comprises a PMOS transistor;
a gate of the second transistor is coupled to the drain of the follower transistor;
a source of the second transistor is coupled to the second current source; and
the third transistor comprises PMOS transistor.

* * * * *